(12) United States Patent
Curcio et al.

(10) Patent No.: US 6,504,111 B2
(45) Date of Patent: Jan. 7, 2003

(54) SOLID VIA LAYER TO LAYER INTERCONNECT

(75) Inventors: Brian E. Curcio, Binghamton, NY (US); Donald S. Farquhar, Endicott, NY (US); Voya R. Markovich, Endwell, NY (US); Konstantinos I. Papathomas, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/867,312

(22) Filed: May 29, 2001

(65) Prior Publication Data

US 2002/0179334 A1 Dec. 5, 2002

(51) Int. Cl.⁷ .................................................. H05K 1/11
(52) U.S. Cl. ......................... 174/264; 361/780; 257/691
(58) Field of Search ................................. 174/262, 263, 174/264, 265; 361/780, 792, 793, 794, 795; 257/691

(56) References Cited

U.S. PATENT DOCUMENTS

| 4,328,531 A | * | 5/1982 | Nagashima et al. ........ 361/401 |
| 4,967,314 A | | 10/1990 | Higgins, III |
| 5,191,174 A | | 3/1993 | Chang et al. |
| 5,309,629 A | * | 5/1994 | Traskos et al. ............... 29/830 |
| 5,363,280 A | * | 11/1994 | Chobot et al. .............. 361/794 |
| 5,444,189 A | * | 8/1995 | Nakaso et al. .............. 174/255 |
| 5,545,429 A | | 8/1996 | Booth et al. |
| 5,576,519 A | * | 11/1996 | Swamy ........................ 174/264 |
| 5,699,613 A | | 12/1997 | Chong et al. |
| 5,729,897 A | * | 3/1998 | Schmidt et al. ................ 29/852 |
| 5,734,560 A | * | 3/1998 | Kamperman et al. ........ 174/255 |
| 5,768,108 A | * | 6/1998 | Miura et al. ................. 361/792 |
| 5,870,289 A | * | 2/1999 | Tokuda et al. .............. 174/260 |
| 6,013,876 A | * | 1/2000 | Caporizzo .................... 174/262 |
| 6,023,029 A | | 2/2000 | Armezzani et al. |
| 6,106,891 A | | 8/2000 | Kulesza et al. |
| 6,234,067 B1 | * | 11/2001 | Nishiyama .................... 174/262 |
| 6,323,439 B1 | * | 11/2001 | Kambe et al. ............... 174/255 |

FOREIGN PATENT DOCUMENTS

EP        0 955 795        11/1999

OTHER PUBLICATIONS

Multilayer Substrate with Low Coefficient of Thermal Expansion, Nakamura et al., 2000 International Symposium on Microelect, pp. 235–240.

* cited by examiner

Primary Examiner—Albert W. Paladini
Assistant Examiner—José H. Alcalá
(74) Attorney, Agent, or Firm—Schmeiser, Olsen & Watts; Lawrence R. Fraley

(57) ABSTRACT

The present invention relates to a structure for providing an interconnect between layers of a multilayer circuit board. The structure comprises a stack that includes at least one layer and a via opening that extends through at least one layer of the stack. Each individual via opening is filled with a solid conductive plug and each solid conductive plug has a first contact pad and a second contact pad.

16 Claims, 3 Drawing Sheets

SOLID VIA LAYER TO LAYER INTERCONNECT

BACKGROUND OF THE INVENTION

1. Technical Field

The present invention relates to a method and structure for providing an interconnect between layers of a multilayer circuit board.

2. Related Art

Typically, high density multilayer circuit boards are constructed of several layers joined by dielectric material to form a stack. Each layer may include an electrically conductive element, such as, a signal plane or a power plane. Layer to layer interconnections may be accomplished using vias, which are typically formed by drilling a hole through layers, followed by plating the wall of the hole with an electrically conductive material. The electrically conductive material along the wall of the via interconnects the conductive elements in the layers.

SUMMARY OF THE INVENTION

A first general aspect of the present invention provides a structure comprising:
 a stack comprising an at least one layer;
 a via opening extending through the at least one layer of the stack; and
 wherein the via opening is filled with a solid conductive plug.

A second general aspect of the present invention provides a method comprising:
 providing an at least one layer;
 forming a via opening in the at least one layer; and
 filling the via opening with a solid conductive plug.

A third general aspect of the present invention provides a method comprising:
 forming a plurality of layers;
 forming at least one via opening extending through at least one layer; and
 filling the at least one via opening with a solid conductive plug.

BRIEF DESCRIPTION OF THE DRAWINGS

For an understanding of the present invention, reference should be made to the following detailed description taken in connection with the accompanying drawings wherein.

DETAILED DESCRIPTION OF THE INVENTION

Figure 1:
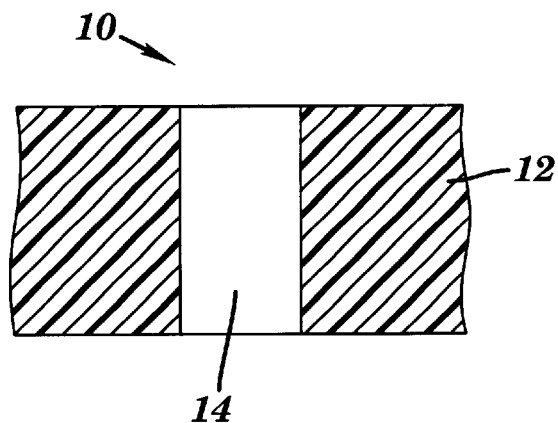
FIG. 1 illustrates a cross sectional view of a related art formation of a via opening in a layer.
Figure 2:
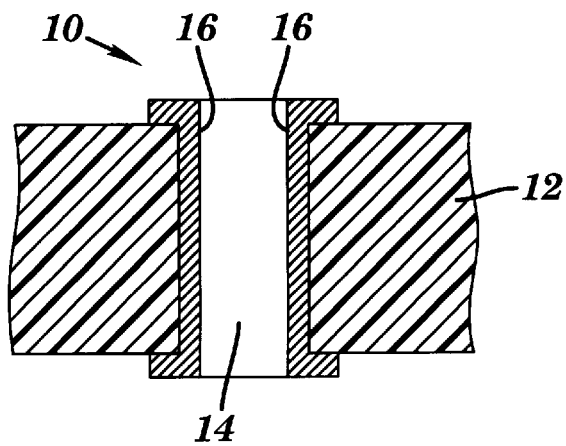
FIG. 2 illustrates the related art layer of FIG. 1 having a planted coating applied to the wall of the via opening.
Figure 3:
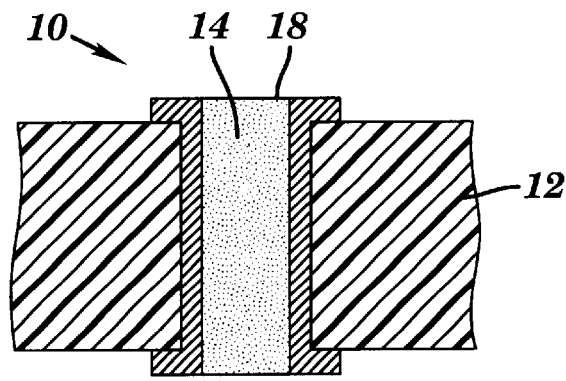
FIG. 3 rates the related art layer of FIG. 2 having a dielectric material deposited within the via opening.

FIGS. 1–3 illustrate a related art method of forming a via 10 in a layer 12. The layer 12 may comprise a glass-reinforced epoxy dielectric layer. Typically, a drill, a laser or punch is used to form a via opening 14 in the layer 12. As illustrated in FIG. 2, a conductive plating 16 is deposited on the wall of the via opening 14. As illustrated in FIG. 3, a material 18 may be deposited within the via opening 14 of the via 10.

The present invention eliminates the related art step that requires filling the via opening 14 (FIG. 3) with a material. The via-fill material 18 is typically a polymer that may or may not contain a particulate filler. Depending on the application requirements, the material may be electrically conductive or non-conductive. It serves to reinforce the conductive plating if its mechanical properties are optimized. In addition, it may be overplated with a conductive metal and provide a surface for making connection to a device or to another similar structure in a different layer.

Despite these advantages, via-fill material 18 can be difficult to process, especially considering that there may be tens of thousands of vias 10 that require filling a single printed wiring board.

Figure 5:
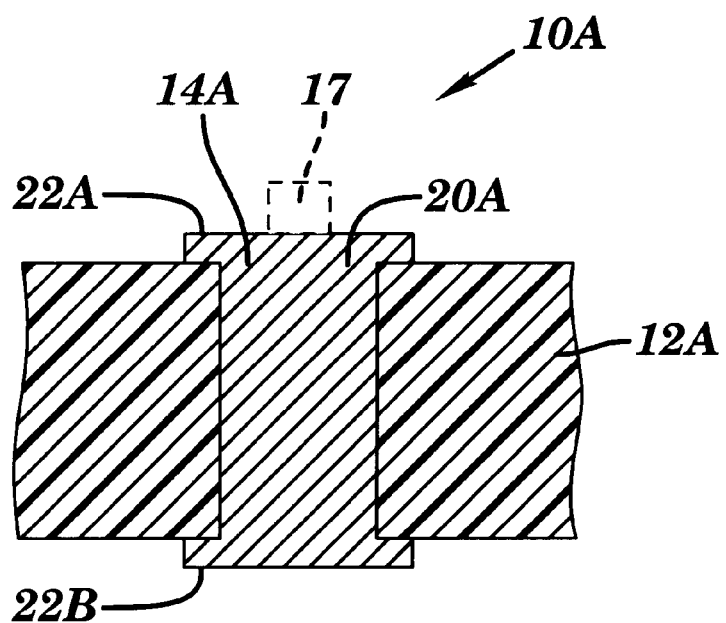
FIG. 5 illustrates the layer of FIG. 4 including a solid conductive plug filling the via opening of the present invention.

The present invention provides a first solid conductive plug 20A that completely fills a first via opening 14A in a first via 10A (FIG. 5).

Figure 4:
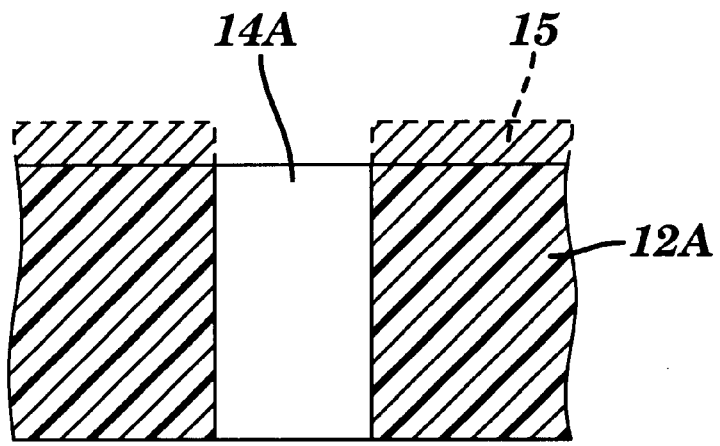
FIG. 4 illustrates a cross sectional view of a via opening in a layer in accordance with the present invention.

FIG. 4 illustrates a first layer 12A including the first via opening 14A. The first via opening 14A is formed in the first layer 12A by any suitable means (e.g., drilling, punching, laser, etc.). The first layer 12A may comprise any suitable material for printed wiring board or chip-carrier dielectric material, such as reinforced or unreinforced materials including epoxy, Bismaleimide-triazine epoxy, cyanate-epoxy blends, flouropolymer dielectrics, etc. The reinforcing may be fiber, such as glass, or particles, such as silica. Additionally, the first layer 12A may include polymide films having an adhesive layer on either side such as a polyimide coated with a thermosetting resin, or an aramid paper impregnated with a thermosetting resin. The first layer 12A may also have an external metallization layer 15 applied to the layer 12A (FIG. 4).

FIG. 5 illustrates the first solid conductive plug 20A completely filling the via opening 14A in the first layer 12A forming a conductive path to any suitable object 17 (e.g., circuit line, electronic device, etc). The first solid conductive plug 20A may comprise any suitable conductive material (e.g., copper, gold, etc.). The solid conductive plug 20A may be formed by any suitable means (e.g., plating, sputtering, etc.). The solid conductive plug 20A may include a first contact pad 22A and a second contact pad 22B. The contact pads 22A, 22B may be formed by any suitable means, (e.g., additive, pattern plating, reverse pulse plating, etc.). The first solid conductive plug 20A provides a solid reliable metallic and mechanically strong via 10A.

Figure 6:
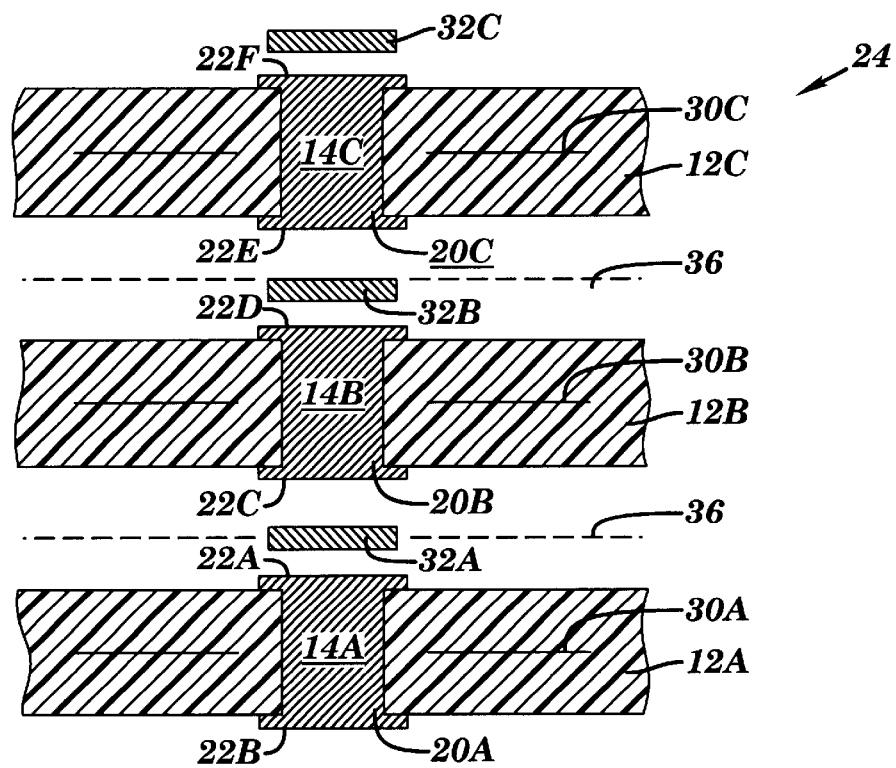
FIG. 6 illustrates a first embodiment of the present invention including an exploded side view of a stack comprising a plurality of layers, a plurality of electrically conductive adhesives, and a dielectric adhesive applied between each layer.

FIG. 6 illustrates an exploded view of a stack 24 in accordance with a first embodiment of the present invention including a plurality of layers 12A–12C. The stack 24 may be included in a high density circuit board, or other similar device. The stack 24 may be one or more layers. The stack 24 includes the first layer 12A, a second layer 12B, a third layer 12C, having the first, a second, and a third via opening 14A, 14B, 14C, respectively, formed therein as described above. The first solid conductive plug 20A, a second solid conductive plug 20B, and a third solid conductive plug 20C, are then deposited within the openings 14A, 14B, 14C, respectively. A first electrically conductive adhesive 32A, a second electrically conductive adhesive 32B, and a third conductive adhesive 32C are formed by any suitable means (e.g., screen printing, stenciling a conductive adhesive) above the solid conductive plugs 20A, 20B, and 20C, respectively. The conductive adhesive 32A, 32B and 32C provide a plurality of conductive connections for conductively connecting the solid conductive plugs 20A, 20B, 20C to any suitable adjacent device (e.g., plated via, solid via, chip, etc.).

The layers 12A–12C may include a plurality of electrically conductive planes 30A–30C, respectively. The electrically conductive planes 30A–30C may carry any suitable electrical current (e.g., signal, power, etc.). The solid conductive plugs 20A–20C may contact selected conductive planes 30A–30C to provide electrical interconnection between selected conductive planes 30A–30C.

Optionally, layers 12A–12C may have additional conductive or metallization layers placed thereon (not shown). The electrically conductive adhesive 32A is deposited between the contact pads 22A and 22C. The electrically conductive adhesive 32B is deposited between the contact pads 22D and 22E. The electrically conductive adhesive 32C is deposited on the contact pad 22F. The electrically conductive adhesive 32A–32C may be deposited by any suitable means (e.g., screen printing, stenciling, etc.). The electrically conductive adhesives 32A–32C may be any suitable adhesive, such as, a conductive metal filled thermosetting polymer. Examples include a silver filled thermoset, such as Ablestick 8175 (made by Ablestick), other suitable electrically conductive adhesives include CB-100 (made by Dupont), JM-3200 (made by Johnson Mathey), Polymet-100 (made by Multicore), and thermosetting resins filled Sn/Bi Cu particles. The electrically conductive adhesive 32 may be heated for a period of time at a temperature until the degree of cure of the electrically conductive adhesive 32 is advanced. For example Ablestick 8175 may be heated at a temperature around 100° C. until the degree of cure is approximately 30%. As an alternative to a thermosetting adhesive, a thermoplastic electrically conductive adhesive filled with metal conductive particles (e.g., silver, gold, palladium, tin, lead, copper etc.) may be used. In the case of a thermoplastic adhesive, heating after dispense may be required to remove any solvents that are in the adhesive. A further alternative is to avoid adhesives or place a low melting point metal that will form a metallurgical joint with the conductive plug 20 (e.g. using a solder joint or layer). For example, a metal alloy such as a Sn/Pb solder may be used by attachment to the plug 20.

A dielectric bonding layer 36 is deposited between the layers 12 of the stack 24 to join the layers 12. The dielectric bonding layer 36 may be deposited by any suitable means (e.g., spraying, coating, screening, etc.). The dielectric bonding layer 36 may be any suitable adhesive, such as a solvent thinned thermosetting, or thermoplastic, dielectric polymer. After dispense, the solvent is removed by drying. If the bonding layer 36 is blanket coated on the layer 12, it must be selectively removed from conductive adhesive 32 by laser ablation, by mechanical drilling, or by selectively exposing and developing as in the case of a photo-sensitive dielectric. As an alternative, the bonding layer 36 may be selectively applied with a mask or screen or stencil, in which case selective removal is obviated.

In another embodiment, a dielectric bonding layer 36 is formed by in a free standing manner by aligning or positioning the layer 36 on the layers 12 (i.e. without using deposition techniques). Apertures are formed in the bond film 36 using any suitable material removal technique such as drilling, punching, or selective etching. In the case of a free standing film the bonding layers 36 may be a partially cured thermosetting or polymer a thermoplastic film, and may contain reinforcing particles or fibers. Further, it could be an adhesive coated polyimide layer such as a bondfilm.

The stack 24 of FIG. 6 is then laminated in a laminating press to apply heat and pressure so all layers may be brought into contact so that the adhesive or solder 36 may be used to join the stack together. In the example where the bonding layer is a high glass transition glass reinforced multifunctional epoxy such as IBM Dri-clad, and the electrically conductive adhesive in Ablestick 8175, suitable lamination conditions would be 180° C. for 90 minutes at 400 psi.

Figure 7:
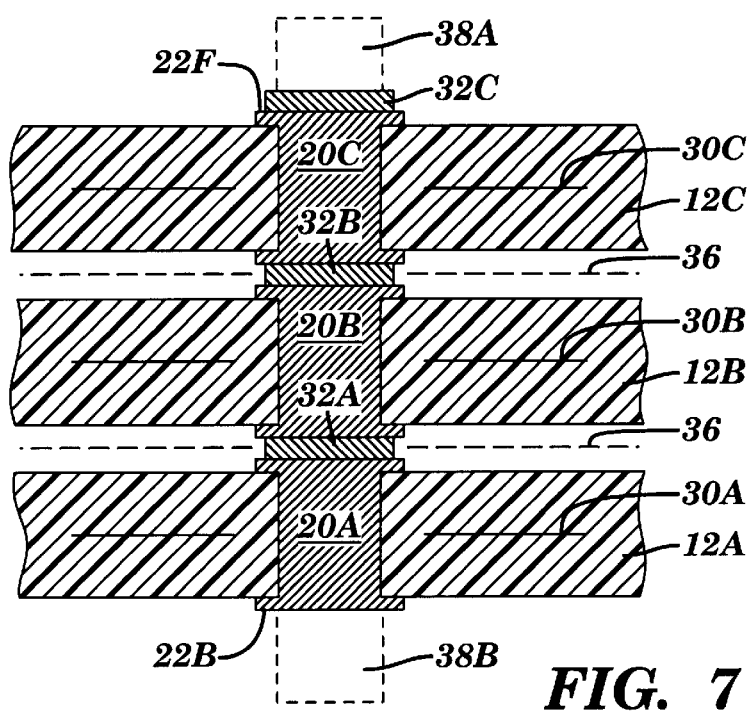
FIG. 7 illustrates a second embodiment of the present invention including stack of FIG. 6, an electronic device connected to a solid conductive plug of a first layer, and an electronic device connected onto an electrically conductive adhesive deposited onto a solid conductive plug of a third layer of the stack.

FIG. 7 illustrates a second embodiment of the present invention. The stack 24 further includes an electronic device 38A and an electronic device 38B mounted on the stack 24. The electronic devices 38A, 38B may be any suitable device (e.g., chip, chip carrier, ball grid array, etc.). The electronic device 38A is connected to the contact pad 22F of the third solid conductive plug 20C. The electrically conductive adhesive 32C connects the electronic device 38A with the contact pad 22F. In this embodiment, it would be required to apply the conductive adhesive 32C subsequent to the aforementioned lamination process. A second electronic device 38B is connected to the second contact pad 22B of the first solid conductive plug 20A by any suitable means (e.g., soldering, conductive adhesive, etc.).

The solid conductive plugs 20A–20C provide the benefits of a stronger and more reliable connection compared with the related art with plated wall vias. The solid conductive plugs 20A–20C provide improved heat dissipation and are void free.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A structure comprising:
    a first layer, wherein a first via extending through the total thickness of the first layer is totally filled with a first electrically conductive plug, and wherein an end of the first plug includes a first contact pad that is in contact with a surface of the first layer; and
    a second layer, wherein a second via extending through the total thickness of the second layer is totally filled with a second electrically conductive plug, and wherein an end of the second plug includes a second contact pad that is in contact with a surface of the second layer, and wherein the second layer is electrically and mechanically coupled to the first layer by an electrically conductive adhesive that is in electrical and mechanical contact with both the end of the first plug and the end of the second plug.

2. The structure of claim 1, wherein each solid conductive plug comprises copper.

3. The structure of claim 1, wherein each layer includes an electrically conductive plane.

4. The structure of claim 3, wherein each electrically conductive plane is selected from the group consisting of a signal plane or a power plane.

5. The structure of claim 1, further including a bonding layer deposited between the first layer and the second layer.

6. The structure of claim 5, wherein the bonding layer comprises a dielectric material.

7. The structure of claim 1, further including an electronic device coupled to the first plug.

8. The structure of claim 7, wherein the electronic device comprises a chip or a chip carrier.

9. The structure of claim 1, wherein the thickness of the first plug is greater than the thickness of the first layer.

10. The structure of claim 1, wherein the diameter of the first contact pad is greater than the diameter of the first plug.

11. The structure of claim 7, wherein the first plug comprises gold.

12. The structure of claim 1, wherein the electrically conductive adhesive comprises an electrically conductive metal filled thermosetting polymer.

13. The structure of claim 1, wherein the electrically conductive adhesive comprises a thermoplastic electrically conductive adhesive filled with metal conductive particles.

14. The structure of claim 13, wherein the thermoplastic adhesive does not include a solvent.

15. The structure of claim 1, wherein the electrically conductive adhesive is in a cured state.

16. The structure of claim 1, wherein the electrically conductive adhesive is in an uncured state.

* * * * *